United States Patent [19]

Puar

[11] 4,342,102
[45] Jul. 27, 1982

[54] SEMICONDUCTOR MEMORY ARRAY

[75] Inventor: Deepraj S. Puar, Sunnyvale, Calif.

[73] Assignee: Signetics Corporation, Sunnyvale, Calif.

[21] Appl. No.: 160,725

[22] Filed: Jun. 18, 1980

[51] Int. Cl.$^3$ .............................................. G11C 7/00
[52] U.S. Cl. ................................... 365/207; 365/104; 365/210
[58] Field of Search ............... 365/104, 184, 205, 206, 365/207, 210; 371/21

[56] References Cited

U.S. PATENT DOCUMENTS

| | | | |
|---|---|---|---|
| 3,614,750 | 10/1971 | Janning | 365/104 |
| 3,938,108 | 2/1976 | Salsbury et al. | 365/104 |
| 4,031,524 | 6/1977 | Heeren | 365/104 |
| 4,094,008 | 6/1978 | Lockwood et al. | 365/184 |

OTHER PUBLICATIONS

Varshney, "Leakage-Compensated Reference Voltage Generator", IBM Tech. Disc. Bul., vol. 22, No. 8A, 1/80, pp. 3237-3238.
Wilson et al., "A 100ns 150mW 64Kbit ROM", Digest of Tech. Papers, ISSCC 1978, 2/16/78, pp. 152, 153, 273.

*Primary Examiner*—Stuart N. Hecker
*Attorney, Agent, or Firm*—Jerry A. Dinardo; Robert T. Mayer; Thomas A. Briody

[57] ABSTRACT

An improved read-only memory arrangement for generating a differential output signal within the memory array itself incorporates a column of reference cell transistors and a single reference bit line within the same general area occupied by the memory cell transistors and memory main bit lines. Each word line is coupled to the gate of one of the reference cell transistors as well as to the gates of the memory cell transistors lying in the same row. The reference bit line voltage is maintained substantially midway between the high and low potential levels of the main bit lines to produce a differential output voltage for sensing purposes.

7 Claims, 2 Drawing Figures

SEMICONDUCTOR MEMORY ARRAY

BACKGROUND OF THE INVENTION

This invention relates to non-volatile memories, such as read-only memories (ROMS), electrically programmable read-only memories (EPROMS), and electrically programmable and electrically erasable read-only memories (EEPROMS), and more particularly to improved means for generating a differential output signal in such memories.

Differential sense amplifiers for ROMS are known which sense the state of a memory cell by detecting the difference in potential between the gate of a reference transistor having a fixed reference potential and the gate of another transistor coupled to the column line of the memory cell. U.S. Pat. No. 3,938,108 discloses an example of such a differential sense amplifier. In that patent a dummy cell of the same dimensions as the memory cell and having its gate tied to a fixed voltage is used to provide the reference voltage level. The dummy cell is located outside the memory cell area. Thus, while the gate of the dummy cell is held at some fixed potential between ground and supply voltage, the gate of the transistor coupled to the column line will vary between ground and the supply voltage when the memory is accessed. Access time of 200-300 nanoseconds is asserted for the memory disclosed in the patent.

SUMMARY OF THE INVENTION

According to this invention an improved memory arrangement is disclosed for generating a differential output signal within the memory array itself. The memory array includes not only the usual array of memory cell transistors, along with intersecting main bit lines and word lines, but also incorporated within the memory array are a column of reference cell transistors and a single reference bit line that services all main bit lines.

According to an important feature of the invention, each word line is coupled not only to the gates of the memory cell transistors but also to the gate of a respective one of the reference cell transistors lying in the same row as the memory cell transistors. By appropriately proportioning the relative gains of the memory cell and reference cell transistors and also the relative gains of pull-up load transistors associated with the main bit lines and the reference bit line, the reference bit line voltage is always maintained substantially midway between the high and low potential levels of the main bit lines. The differential voltage thus developed across the reference bit line and a selected main bit line may be further amplified in one or more differential amplifier stages.

DESCRIPTION OF THE PREFERRED EMBODIMENT

Figure 1:
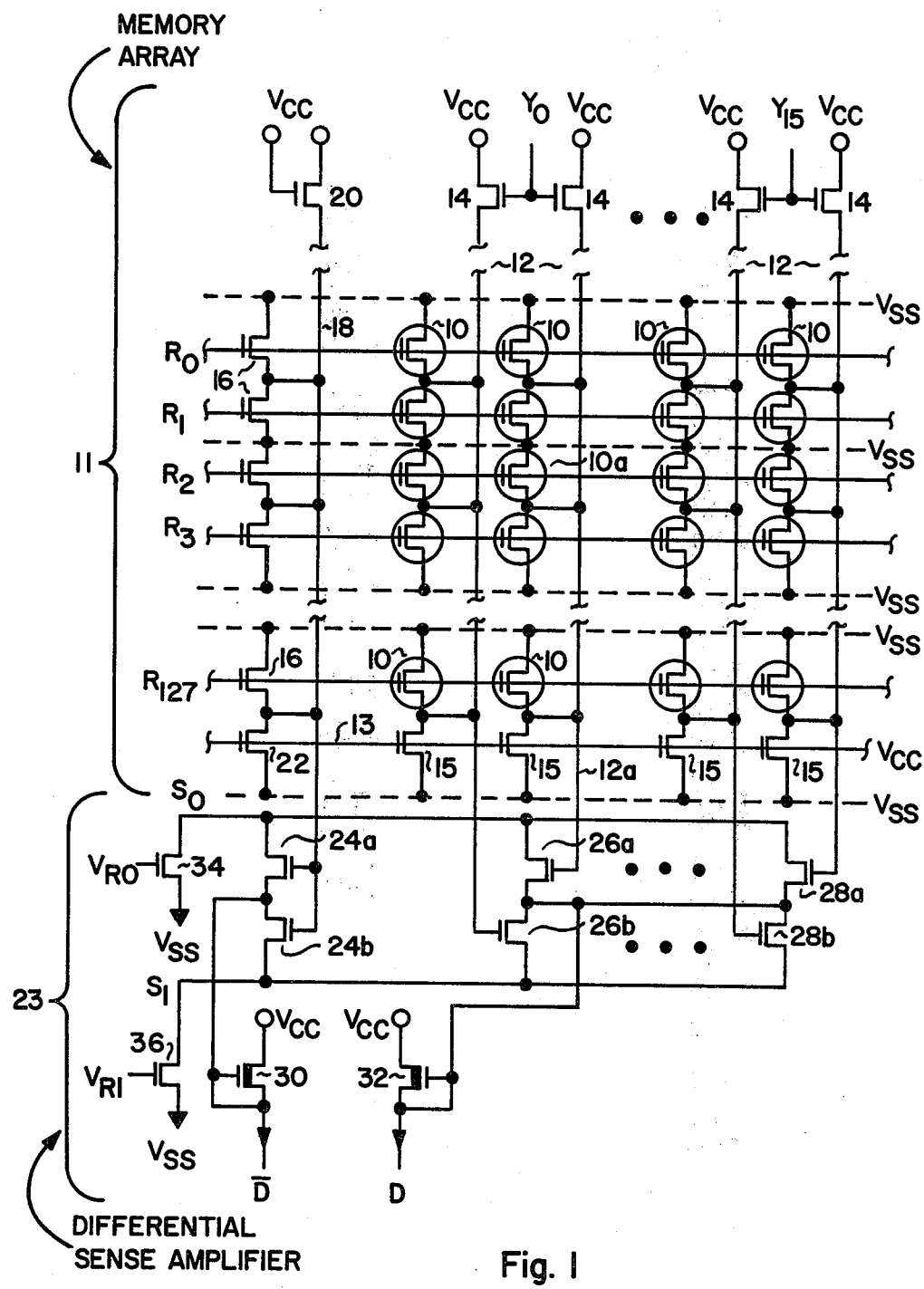
FIG. 1 is a circuit diagram of a read-only memory array according to the invention.

In FIG. 1 there is shown a read-only memory array according to the invention. The form of memory shown is mask programmable, which is the non-erasable kind. However, the memory arrangement according to the invention may be incorporated in other kinds of non-volatile memories, such as electrically programmable memories of the non-erasable or erasable kind. In this figure, a programmable memory element, such as a transistor, is shown within a circle, whereas a fixed transistor is shown without such a circle.

A plurality of columns and rows of programmable memory cell transistors 10 are arranged within a memory array 11. Column lines or main bit lines 12 extend vertically between the columns of memory cell transistors 10. While the presence or absence of a memory cell transistor 10 at any particular memory location may be determined beforehand, all locations of the memory cell transistors are shown filled and connected. However, it is understood that during manufacture some of these locations may be masked to either exclude a memory cell transistor 10 or to open up a connecting link to the memory cell transistor.

The sources of the memory cell transistors 10 are coupled to common ground $V_{ss}$, and the drains are coupled to the main bit lines 12. The main bit lines 12 are coupled at one end to a voltage supply $V_{cc}$ through pull-up load transistors 14 which are gated by column decode lines $Y_0 \ldots Y_{15}$, and are also coupled at the opposite end to common ground $V_{ss}$ through pull-down transistors 15 which have their gates tied to the voltage supply $V_{cc}$ through a bus conductor 13. Each column decode line is coupled to two main bit lines 12.

Included within the memory array 11 itself in close proximity to the area occupied by memory cell transistors 10 is a column of reference cell transistors 16 and a reference bit line 18. The sources of the reference cell transistors 16 are coupled to common ground $V_{ss}$, and the drains are coupled to the reference bit line 18. The reference bit line 18 is coupled at one end to the voltage supply $V_{cc}$ through a pull-up load transistor 20, which has its gate tied to the voltage supply $V_{cc}$, and is also coupled at the opposite end to common ground $V_{ss}$ through a pull-down transistor 22, which has its gate tied to the voltage supply $V_{cc}$ through the bus conductor 13.

A plurality of word or row decode lines $R_0 \ldots R_{127}$ extend horizontally along the rows of memory cell transistors 10, each row also including a reference cell transistor 16. Each of the row decode lines is coupled separately to all of the gates of the memory cell transistors 10 and to the gate of the reference cell transistor 16 lying in a given row.

A differential sense amplifier 23 receives differential inputs from the main bit lines 12 and the reference bit line 18. The input from the reference bit line 18 is received by the gates of two reference input transistors 24a and 24b. The inputs from each pair of main bit lines served by a column decode line are received by the gates of a pair of main input transistors, such as 26a, 26b for the two bit lines coupled to decode line $Y_0$, and 28a, 28b for the two bit lines coupled to decode line $Y_{15}$.

The drains of the two reference input transistors 24a, 24b are connected to a first common drain node $\overline{D}$, which is coupled to the voltage supply $V_{cc}$ through a depletion load transistor 30 having its gate tied to its source. Similarly, the drains of the main input transistors 26a, 26b, 28a, 28b are connected to a second common drain node D, which is coupled to the voltage supply $V_{cc}$ through another depletion load transistor 32 having its gate tied to its source.

The sources of one reference input transistor 24a and of corresponding main input transistors 26a, 28a, are connected in common to a first source node $S_0$ and through a first gating transistor 34 to common ground $V_{ss}$. Similarly, the sources of the other reference input transistor 24b and of the other main input transistors 26b, 28b are connected in common to a second source node $S_1$ and through a second gating transistor 36 to common ground $V_{ss}$.

The gating transistors 34 and 36 may be gated by switching voltage inputs $V_{R0}$ AND $V_{R1}$, respectively, which are equal to the supply voltage $V_{cc}$. The voltages $V_{R0}$ and $V_{R1}$ select one of the two main bit lines 12 served by each of the column decode lines $Y_0 \ldots Y_{15}$. While there are two main bit lines 12 shown for each column decode line $Y_0 \ldots Y_{15}$, this is done primarily for the purpose of conserving space on the die. If desired, there may be one column decode line for each main bit line, in which case only one of the gating transistors 34 or 36 is necessary and the other one can be omitted.

In the memory unit shown in this particular embodiment, there are 16 column decode lines and two memory cell columns for each decode line, for a total of 32 columns of memory cells. Also there are 128 word lines or row decode lines, with one row of memory cells for each word line, giving a total of 120 rows of memory cells. The total number of memory bits is $128 \times 32$ or 4096 bits. Eight such memory units can be combined on a single chip to give a $4K \times 8$ (32K) memory, for example.

According to one arrangement the reference cell transistor 16 is about one-half the size of, and thus has about one-half the gain of, the memory cell transistors 10. The pull-up load transistors 14 and 20 are equal in size and have a higher gain than the memory cell transistors 10. The pull-down transistors 15 have gains equal to that of pull-down transistor 22 on the reference bit line 18. According to one alternative, the reference cell transistor 16 may be the same size as the memory cell transistor 10 and the pull-up load transistor 14 can be about one-half the gain of the pull-up load transistor 20. According to another alternative, reference cell transistor 16 may be the same size as memory cell transistors 10, the pull-up load transistors 14 may be the same size as pull-up load transistor 20, and the pull-down transistors 15 may have a different gain than pull-down transistor 22. The pull-up load transistor 20 on the reference bit line 18 has its gate tied to the voltage supply $V_{cc}$ while the pull-up load transistors 14 on the main bit lines 12 are selected by the respective column decode line $Y_0 \ldots Y_{15}$, whose potential is at supply voltage $V_{cc}$ when selected and at common ground $V_{ss}$ when not selected. The pull-down transistors 15 are for the purpose of discharging to ground the potential of their respective main bit lines when those bit lines are not selected.

The relative gains of the pull-up load transistors 14 and the pull-down transistors 15 on the main bit lines 12 are chosen such that the potential on a selected main bit line 12 is one volt lower when a memory cell transistor 10 is programmed in, than when it is programmed out and the corresponding row decode line $R_0 \ldots R_{127}$ and column decode line $Y_0 \ldots Y_{15}$ are selected. Since the reference cell transistor 16 has about one-half the gain of the memory cell transistors 10 and is also gated by the same row decode line, the reference potential is typically midway between the two potential levels of the main bit line. Also the gain of the pull-up load transistors 14 is made relatively high so that it can quickly charge up the parasitic capacitance on a main bit line 12 from common ground up to its final value when the corresponding column decode line $Y_0 \ldots Y_{15}$ is selected.

In operation, suppose column decode line $Y_0$, row decode line $R_2$, and gate input $V_{R0}$ to the gating transistor 34 are selected. The gating transistor 34 will conduct, pulling source line $S_0$ to about 1 volt and thereby providing a current path to ground for all the transistors connected to source line $S_0$; namely reference pull-down transistor 24a and such memory cell pull-down transistors as 26a and 28a. The reference bit line 18 will be selected because it is connected to the gate of the pull-down transistor 24a. The main bit line 12a connected to the gate of pull-down transistor 26a will be selected. As a result of this main bit line selection and the selection of row decode line $R_2$, the memory cell transistor 10a at the intersection of these two lines will be selected.

The potential of the selected main bit line 12a is either higher or lower than the potential of the reference bit line 18, depending upon whether the selected memory cell transistor 10a is programmed out or programmed in, respectively. This results from the voltage divider arrangement of the pull-up load transistor 14 in series with the parallel combination of the memory cell transistor 10a in shunt with the pull-down transistor 15. The unselected main bit lines are held at ground potential through the pull-down transistor 15. Thus a differential signal input applied between the gates of input transistors 24a and 26a results in an amplified differential output across the drain nodes $\overline{D}$ and $D$.

Since the absolute potential of the bit lines is not important, the pull-up load transistors 14 and 20 may be high gain transistors for fast bit line charging times. Also, the differential voltage developed across the reference bit line 18 and the selected main bit line 12 can be as small as allowed by the sensitivity of the differential amplifier.

Figure 2:
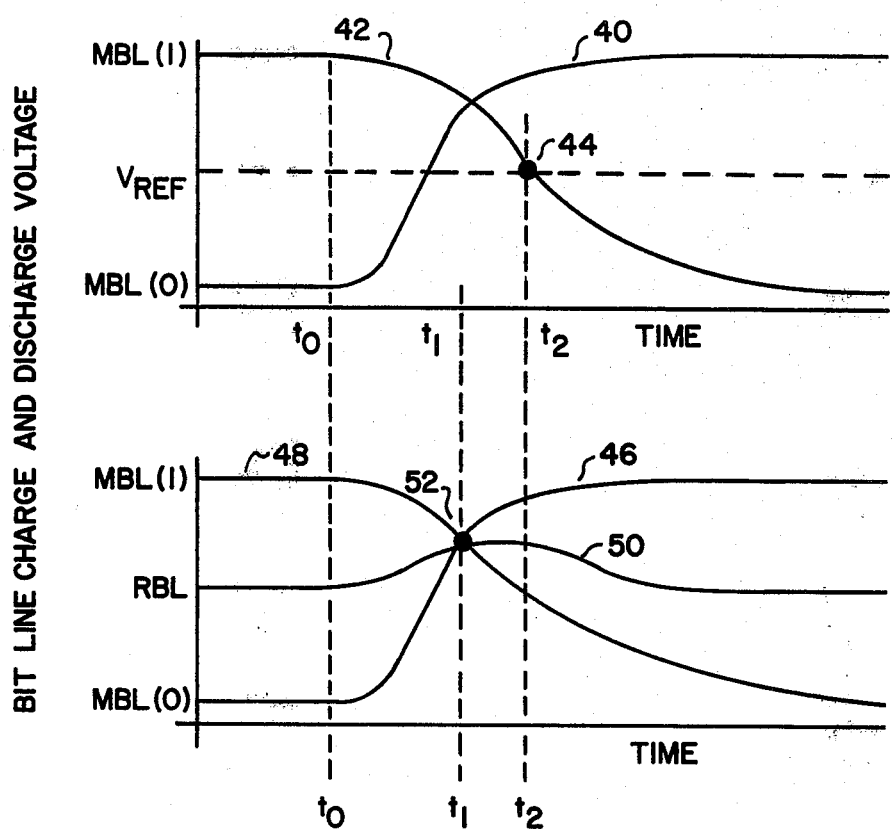
FIG. 2 is a graph of waveforms useful in explaining the operation of the invention.

Reference is now made to FIG. 2 which shows a comparison of bit line charging and discharging waveforms for a memory arrangement according to the prior art and for a memory arrangement according to the invention. For the prior art, curve 40 shows the charging of a main bit line from its zero (0) state to the one (1) state and curve 42 shows the discharging of the main bit line from its one (1) state to the zero (0) state. The voltage reference level $V_{REF}$ is a constant level between the zero and one levels. The intersection point 44 on the reference level $V_{REF}$ represents the point where both curves 40 and 42 have reached their transition above and below the reference level $V_{REF}$. The transition point 44, which is the earliest time that the differential amplifier can sense the differential voltage, occurs at time $t_2$ after initial time $t_0$.

For the arrangement according to the invention, curve 46 shows the charging of the main bit line, curve 48 shows the discharging of the main bit line, and curve 50 shows the voltage on the reference bit line. Instead of being at a fixed reference voltage level, the reference bit line voltage varies so that it is always approximately midway between the two voltage levels of the main bit lines. Since the charging time of a main bit line is faster than the discharging time, the reference voltages rises along with the charging curve 46 until the transition point 52 is reached, which is the point where all three curves 56, 48, 50 intersect. This transition point 52 occurs at time $t_1$, which is an earlier point in time than $t_2$, the transition point for the prior art. The reference bit line voltage varies because the pull-down transistor 22 on the reference bit line 18 is gated by the same word line voltage $V_{cc}$ that gates the pull-down transistors 15 on the main bit line 12.

It will be apparent from the comparison of the two graphs of FIG. 2 that the memory arrangement according to this invention provides faster access to the memory than can be accomplished by the prior art. Access times as low as 100 to 150 nanoseconds can be achieved as compared with 200 to 300 nanoseconds for the prior art.

While the illustrated embodiment has described a 32K ROM, it will be apparent to those skilled in the art that the invention can also be applied to memories of other densities and configurations. The principles of the invention can likewise be applied to EPROMS and EEPROMS.

What is claimed is:

1. In a semiconductor memory array including a plurality of memory cell transistors arranged in rows and columns and a plurality of main bit lines extending parallel to said columns, each main bit line coupled to a separate column of said memory cell transistors, the combination comprising:
   (a) a column of reference cell transistors and a reference bit line extending parallel to said memory cell transistor columns and located within the same area of the memory array as said memory cell transistors;
   (b) a plurality of word lines extending parallel to said rows of memory cell transistors and coupled respectively to the gates of the memory cell transistors and to the gate of the reference cell transistor lying in a given row;
   (c) pull-up load transistor means coupled to each of said main bit lines and to said reference bit line;
   (d) pull-down transistor means coupled to each of said main bit lines and to said reference bit line; and
   (e) means coupled between said reference bit line and each of said main bit lines to sense the presence or absence, effectively, of a memory cell transistor at an address determined by selecting a given word line and a given main bit line, characterized in that said pull-up load transistor means, said pull-down transistor means, said memory cell transistors, and said reference cell transistors are so related in size and gain that with operating voltages applied to said reference bit line and said main bit lines through said pull-up load transistor means, a difference in current through respective pull-up and pull-down transistor means of the reference bit line and main bit line will cause the selected main bit line to assume either a high potential level above the potential of said reference bit line to indicate the absence of a memory cell transistor at the selected memory cell address or a low potential level below the potential of said reference bit line to indicate the presence of a memory cell transistor at the selected memory address.

2. The invention according to claim 1 wherein said transistors and transistor means are so related that the potential of said reference bit line is approximately midway between the high and low potential levels of the selected main bit line.

3. The invention according to claim 1, wherein said memory further includes a plurality of column decode lines and a plurality of row decode lines, said column decode lines coupled individually to at least one main bit line, each of said row decode lines coupled separately to an individual row of memory cell transistors and to an individual reference cell transistor of said column of reference cell transistors.

4. The invention according to claim 1, wherein said pull-up load transistor means includes a first transistor coupled in series with a respective main bit line and a second transistor coupled in series with said reference bit line.

5. The invention according to claim 1, wherein the means in (e) comprises a differential amplifier for sensing the differential voltage developed across said main and reference bit lines when operating potentials are applied to said memory array.

6. In a semiconductor memory array including a plurality of memory cell transistors arranged in rows and columns and a plurality of main bit lines extending parallel to said columns, each main bit line coupled to a separate column of said memory cell transistors, the combination comprising:
   (a) a column of reference cell transistors and a reference bit line extending parallel to said memory cell transistor columns and located within the same area of the memory array as said memory cell transistors;
   (b) a plurality of word lines extending parallel to said rows of memory cell transistors and coupled respectively to the gates of the memory cell transistors and to the gate of the reference cell transistor lying in a given row;
   (c) pull-up load transistor means including a first transistor coupled in series with each of said main bit lines and a second transistor coupled in series with said reference bit line, said first and second transistors having substantially equal gains greater than that of said memory cell transistors;
   (d) pull-down transistor means coupled to each of said main bit lines and to said reference bit line; and
   (e) means coupled between said reference bit line and each of said main bit lines to sense the presence or absence, effectively, of a memory cell transistor at an address determined by selecting a given word line and a given main bit line.

7. In a semiconductor memory array including a plurality of memory cell transistors arranged in rows and columns and a plurality of main bit lines extending parallel to said columns, each main bit line coupled to a separate column of said memory cell transistors, the combination comprising:
   (a) a column of reference cell transistors and a reference bit line extending parallel to said memory cell transistor columns and located within the same area of the memory array as said memory cell transistors;
   (b) a plurality of word lines extending parallel to said rows of memory cell transistors and coupled respectively to the gates of the memory cell transistors and to the gate of the reference cell transistor lying in a given row;
   (c) pull-up load transistor means including a first transistor coupled in series with each of said main bit lines and a record transistor coupled in series with said reference bit line;
   (d) pull-down transistor means including a third transistor coupled in series with each of said first transistors, a fourth transistor coupled in series with said second transistor, and means coupling the gates of said pull-down transistors in common; and
   (e) means coupled between said reference bit line and each of said main bit lines to sense the presence or absence, effectively, of a memory cell transistor at an address determined by selecting a given word line and a given main bit line.

* * * * *